United States Patent [19]

Gray et al.

[11] Patent Number: 4,555,742
[45] Date of Patent: Nov. 26, 1985

[54] SHORT DETECTION CIRCUIT AND METHOD FOR AN ELECTRICAL LOAD

[75] Inventors: Randall C. Gray, Scottsdale; Robert B. Jarrett, Tempe, both of Ariz.

[73] Assignee: Motorola, Inc., Schaumburg, Ill.

[21] Appl. No.: 608,335

[22] Filed: May 9, 1984

[51] Int. Cl.[4] .............................................. H02H 3/08
[52] U.S. Cl. ................................. 361/93; 330/207 P; 361/20; 361/98; 361/101
[58] Field of Search ...................... 361/20, 21, 93, 98, 361/100, 101; 323/285; 330/207 P

[56] References Cited

U.S. PATENT DOCUMENTS

| | | | |
|---|---|---|---|
| 3,845,405 | 10/1974 | Leidich | 361/98 X |
| 3,967,207 | 6/1976 | Wheatley, Jr. | 330/207 P X |
| 4,155,107 | 5/1979 | Osborne et al. | 361/20 |
| 4,321,648 | 3/1982 | Kaplan | 361/101 |
| 4,355,344 | 10/1982 | Felici et al. | 330/207 P X |

FOREIGN PATENT DOCUMENTS 197712 12/1977 U.S.S.R. ................................. 361/20

Primary Examiner—Harry E. Moose, Jr.
Attorney, Agent, or Firm—William J. Kubida; Dale E. Jepsen

[57] ABSTRACT

A short detection circuit and method for operatively controlling current in an electrical load such as an alternator field coil includes a driving device such as a Darlington transistor for driving the electrical load. Detecting means selectively withhold and provide operating current to the driving means when a shorted and not shorted condition of the electrical load is respectively detected at the driven terminal of the driving device.

5 Claims, 1 Drawing Figure

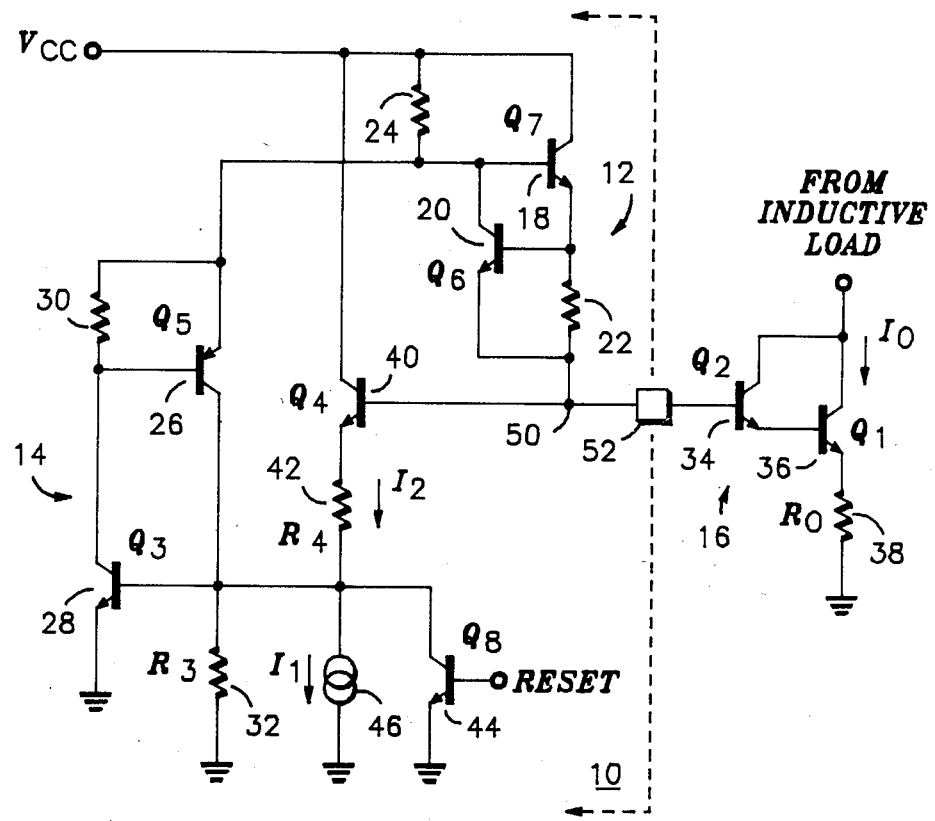

SHORT DETECTION CIRCUIT AND METHOD FOR AN ELECTRICAL LOAD

BACKGROUND OF THE INVENTION

The present invention relates, in general, to the field of short detection circuits and methods for electrical loads. More particularly, the present invention relates to a circuit and method of especial utility in automotive regulators having a field coil driven by a Darlington transistor.

The great majority of modern automobiles utilize an alternator as a power source for the vehicle's electrical system as well as to recharge the starting battery. Such alternators incorporate a stator coil surrounding a rotating field coil mounted within a stamped or cast metal case. In most current applications, this case is bolted to the engine and is therefore at a negative, or ground potential with respect to the field coil which is tied to a supply voltage line at either the positive terminal of the battery or the diode trio of the alternator.

This field coil is ordinarily driven by means of a Darlington transistor, the function of which is controlled by the output of a voltage regulator. Increasingly, the output Darlington and regulator are mounted internally within the alternator case in a module comprising a hybrid integrated circuit or other type of common substrate device where a precise interrelation of temperature coefficients (TC) among the various devices comprising the regulator and Darlington are necessary due to the latter's power dissipation as well as heat internally generated within the alternator or otherwise experienced in the environment of the engine compartment.

A particularly high failure rate for such alternators occurs when the Darlington side of the field coil becomes shorted to the battery. Under ordinary operating conditions, approximately one volt appears across the saturated Darlington resulting in a power dissipation of about 5 watts. When shorted to battery, currents on the order of 10 amps may be experienced at a level of 10 volts or more resulting in a 20 fold increase in power dissipation through the Darlington resulting in its catastrophic failure even when experiencing only a transistory short. Such transitory shorts are most apt to occur due to foreign material within the alternator which may short the field coil brush connection to the supply brush connection. Although manufactured and tested separately, the regulator and alternator are generally assembled together and installed in a new vehicle such that a momentary short may occur when the new vehicle is started up to exit the assembly line. In such instances, the small metal filings or flash from the alternator case or other machined portions of the engine which can precipitate such a short will cause the vehicle to be rejected and necessitate replacement of the alternator/regulator combination. Even though the alternator can later be disassembled and a new regulator installed, the regulator is nonetheless irreparably damaged due to the short circuit current surge in the Darlington driver, however transistory. Were it possible to prevent such overcurrent damage for even a few minutes of operation, generally any internal debris will be blown out of the alternator by its rotation and the above-described failure mode would be much less frequently encountered.

Concomitant concerns with internally mounted alternator regulators include the size of the integrated circuit die and the interdependent number and spacing of bonding pads to the regulator chip module. While die size, of course, directly relates to chip cost, generally spacing between bonding pads must, nonetheless, be a minimum of about 20 mils. Therefore, the number of bonding pads required to interface with the external Darlington and other devices will to a great extent dictate the physical dimension of the die.

Prior art devices have heretofore required two pins for effective alternator field coil operation. One pin is utilized to supply a driving current to the external Darlington base terminal while a second feedback pin is resistively connected to the emitter of the Darlington. An additional resistor couples the feedback pin to circuit ground while a sense resistor similarly connects the emitter of the Darlington to ground. Thus, an additional bonding pad and two trim resistors are necessary to sense voltage across the sense resistor at the feedback pin connected to the Darlington emitter. Moreover, by the nature of the overcurrent sensing employed through the use of a feedback pin, a precision low voltage reference is required within the regulator. Such a precision low voltage reference is inherently different to provide as well as requiring a not inconsiderable amount of on-chip real estate.

SUMMARY OF THE INVENTION

It is therefore an object of the present invention to provide an improved short detection circuit and method for an electrical load.

It is further an object of the present invention to provide an improved short detection circuit and method for an electrical load which is readily and inexpensively fabricated using a minimum of components and on-chip area.

It is still further an object of the present invention to provide an improved short detection circuit and method for an electrical load which effectively precludes current damage to an external Darlington or other electrical load driving device in the event of a short.

It is still further an object of the present invention to provide an improved short detection circuit and method for an electrical load which does not require a feedback pin or external trim resistors to sense an overcurrent condition in the electrical load.

It is still further an object of the present invention to provide an improved short detection circuit and method for an electrical load which does not necessitate a significant increase in regulator die size.

It is still further an object of the present invention to provide an improved short detection circuit and method for an electrical load in which a constant relationship between temperature coefficients of the various devices is maintained under all operating conditions.

The foregoing and other objects are achieved in the present invention wherein there is provided a short detection circuit and method for operatively controlling current in an electrical load connected to a source voltage line. Means are provided for driving the electrical load having first, second and third terminals thereof, the first terminal being connected to the electrical load and the second terminal being connected to a common voltage line. Means are also provided for detecting a short circuit current in the electrical load connected to the third terminal of the driving means. The detecting means selectively withholds and provides an operating current to the driving means when a shorted and not shorted condition of the electrical load to the source voltage line is respectively detected at the third terminal of the driving means.

BRIEF DESCRIPTION OF THE DRAWINGS

The above-mentioned and other features and objects of the present invention and the manner of attaining them will become more apparent and the invention itself will be best understood by reference to the following description of an embodiment of the invention taken in conjunction with the accompanying drawings, wherein:

The sole FIGURE is a schematic diagram of a short detection circuit in accordance with the present invention for use in conjunction with an electrical load driving means such as a Darlington transistor for utilization in driving, for example, an inductive load such as an alternator field coil.

DESCRIPTION OF A PREFERRED EMBODIMENT

With reference to the single FIGURE, a short detection circuit 10 is shown. Short detection circuit 10 comprises in major part, a current source 12, and an SCR 14 to operably control a power Darlington 16 for use, for example, in an alternator voltage regulator.

Current source 12 includes an NPN transistor 18 having its collector terminal connected to a source of supply voltage, $V_{CC}$. The base terminal of NPN transistor 18 is connected to the collector terminal of NPN transistor 20, which respective terminals are coupled to $V_{CC}$ through resistor 24. The emitter terminal of NPN transistor 18 is connected to the base terminal of NPN transistor 20 and these respective terminals are coupled to the emitter of NPN transistor 20 through resistor 22. The emitter terminal of NPN transistor 20 is connected to base node 50 as will be more fully described hereinbelow.

SCR 14 includes a PNP transistor 26 having its emitter connected to the collector and base terminals of NPN transistors 20, 18 respectively. Resistor 30 couples the emitter terminal of PNP transistor 26 to its base terminal which is connected to the collector of NPN transistor 28. The collector of PNP transistor 26 is connected to the base terminal of NPN transistor 28 as well as to circuit ground through resistor 32 having a value $R_3$. The emitter terminal of NPN transistor 28 is connected to circuit ground also. The base and collector terminals of NPN transistor 28 and PNP transistor 26 respectively define a current node 48 as will be more fully described hereinafter.

NPN transistor 40 has its collector terminal connected to $V_{CC}$ and its base terminal connected to base node 50. The emitter terminal of NPN transistor 40 is connected through resistor 42 having a value $R_4$ to current node 48. A current source 46 is connected between current node 48 and circuit ground as shown. Additionally, NPN transistor 44 has its collector terminal connected to current node 48 and its emitter terminal connected to circuit ground. The base terminal of NPN transistor 44 defines a reset input to short detection circuit 10.

Power Darlington 16 comprises NPN transistors 34, 36. The base terminal of NPN transistor 34 is connected to base node 50 by means of bonding pad 52 of short detection circuit 10 and its emitter terminal is connected to the base terminal of NPN transistor 36. The emitter terminal of NPN transistor 36 is connected to circuit ground through resistor 38 having a value $R_0$. A current $I_0$ is applied to the common connected collector terminals of NPN transistors 34, 36. Current source 46 supplies a current $I_1$ while the current through resistor 42 is defined as having a value $I_2$. For purposes of further circuit analysis, NPN transistors 36, 34 of power Darlington 16 are additionally defined as $Q_1$ and $Q_2$ respectively. Similarly, NPN transistors 28 and 40 are further referred to as $Q_3$ and $Q_4$ respectively while PNP transistor 26 is referred to as $Q_5$ and NPN transistors 20, 18 and 44 are defined as $Q_6$, $Q_7$ and $Q_8$ respectively.

$I_0$ is the current required to trip SCR 14 and disable current source 12. It can be seen that:

$$I_0 R_0 + V_{BE}Q_1 + V_{BE}Q_2 = V_{BE}Q_4 + I_2 R_4 + V_{BE}Q_3 \qquad (1)$$

Therefore:

$$I_0 R_0 = V_{BE}(Q_4 + Q_3 - Q_1 - Q_2) + I_2 R_2 \qquad (2)$$

Since, to a first order approximation, the $V_{BE}$ values of NPN transistors 34, 36 of power Darlington 16 are set to match those of NPN transistors 40, 28 these terms cancel and:

$$I_0 R_0 = I_2 R_4 \qquad (3)$$

It may further be seen that:

$$I_2 = I_1 + V_{BE}Q_3/R_3 \qquad (4)$$

where current source 46 is a zero temperature coefficient (TC) source.

Therefore, adjustment of $I_1$ and $V_{BE}Q_3/R_3$ allows for the generation of the proper TC at resistor 42 ($R_4$) to cancel $I_0 R_0$ and any second order differences in the matching of power Darlington 16 to NPN transistors 40, 28.

In operation, assuming a normal field current of approximately 5 amps, and a value for resistor 38 of 100 milliohms, approximately half a volt will be dropped across resistor 38. This one-half volt plus the $V_{BE}$ values of NPN transistors 34, 36 provide a voltage at base node 50 of:

$$I_0 R_0 + V_{BE}Q_1 + V_{BE}Q_2.$$

Assuming a maximum allowable field current of approximately twice $I_0$ or 10 amps, $V_{OUT}$, (or $I_0 R_0$), would trip SCR 14 at a level of approximately 1 volt plus the $V_{BE}$ values of NPN transistors 34 and 36. Therefore, a sufficiently high voltage level on base node 50 will provide current to the base of NPN transistor 40 which is in turn supplied to the base of NPN transistor 28. This base current to NPN transistor 28 is beta multiplied to in turn activate PNP transistor 26 thus latching SCR 14.

The reset input to NPN transistor 44 is supplied during the reset of a saw tooth waveform from a constant frequency switching regulator with which short detection circuit 10 may be integrated. The reset input to NPN transistor 44 is derived from the oscillator that does the voltage regulator control. This oscillator, by system design, cannot be on during the fall time of the saw tooth waveform which is generated. Therefore, every time the oscillator is reset, SCR 14 is reset had it been previously set during an overcurrent condition sensed through power Darlington 16. As can be seen, should a short occur in the inductive load, it wouldn't matter if the short were present during the reset time of the alternator because it cannot be on by design. Should a short be present when the oscillator controlled regulator turns the inductive load current on, an overvoltage condition would be present at base node 50 which would, in turn, within a few tenths of a microsecond set SCR 14 in turn shutting off the output of short detection circuit 10. Therefore, even though a short may have occurred in the inductive load, short detection circuit 10 never allows a power pulse to last in power Darlington 16 more than approximately one microsecond. This is because should a short circuit have occurred, there is no dI/dt as the inductance has been eliminated due to the short circuit. This having occurred, as soon as base drive is supplied to power Darlington 16 the voltage of sense resistor 38 increases such that $V_{OUT}$, (or the voltage across resistor 38), reaches the threshold of detection thus latching SCR 14. Therefore, base drive to power Darlington 16 is off for the greater portion of the duty cycle of the oscillator. This results in an on-time of power Darlington 16 on the order of but a few microseconds. In general, power Darlington 16 is capable of sustaining an overcurrent for approximately 180 milliseconds.

As a result, during short circuit operation, there is never large power concentrations in power Darlington 16 and therefore, the temperatures of these devices do not get excessively hot during short circuit conditions of the inductive load. This is highly desirable since power Darlington 16 is not located monolithically with short detection circuit 10, but is mounted, rather, on a common base plate. The oscillator input to reset line of NPN transistor 44 also presents an advantage that, should a short in the inductive load be merely intermittent, as soon as the short disappears, SCR 14 will no longer be latched and a normal amount of current will be allowed to flow through the inductive load being driven through power Darlington 16. Utilizing an oscillator having a frequency of approximately 150 Hz, a 6.5 millisecond period is provided to repeatedly check for a shorted condition within the inductive load. Thus, a power build-up will be allowed to occur in power Darlington 16 only for the length of time it takes to produce a voltage drop across resistor 38 up to the threshold of short detection circuit 10. As above described, this condition can occur within a time period of approximately 1 microsecond or less. This results in a duty cycle of approximately one microsecond out of every 6,000 microseconds or approximately 0.016%, therefore obviating any power build-up in power Darlington 16.

What has been provided therefore, is an improved short detection circuit and method for an electrical load which is readily and inexpensively fabricated utilizing a minimum of components and on-chip area. The short detection circuit and method for an electrical load of the present invention effectively precludes current damage to an external Darlington or other electrical load driving device in the event of a short circuit and does not require a feed-back pin or additional external trim resistors to sense an overcurrent condition in the electrical load. The circuit and method of the present invention does not necessitate a significant increase in regulator die size and provides a constant relationship between temperature coefficients of the various devices under all operating conditions.

While there have been described above the principles of the invention in conjunction with specific circuitry, it is to be clearly understood that this description is made only by way of example and not as a limitation to the scope of the invention. For example, it should be noted that the short detection circuit and method of the present invention is useful in devices other than alternator regulators and may be used in conjunction with, for example, hammer drivers for impact printers as well as other applications utilizing solenoids or similar inductive loads. Still further, it can be seen that the principles of the present invention are equally applicable to other types of electrical loads and load devices including resistive loads. Moreover, the circuit and method disclosed are likewise applicable to positively grounded automotive systems employing PNP power Darlington drivers.

We claim:

1. A short detection circuit for operatively controlling current in an electrical load connected to a source voltage line comprising:
    means for driving an electrical load having first, second and third terminals thereof, said first terminal being connected to said electrical load and said second terminal being connected to a common voltage line; and
    means for detecting a short circuit current in said electrical load connected to said third terminal of said driving means, said means for detecting comprising a current source for providing an operating current to said driving means and an SCR for disabling said current source in response to a shorted condition of said electrical load, said detecting means selectively withholding and providing said operating current to said driving means when a shorted and not shorted condition of said electrical load to said source voltage line is respectively detected at said third terminal of said driving means.

2. The short detection circuit of claim 1 wherein said detecting means comprises a reset input for unlatching said SCR.

3. A short detection method for operatively controlling current in an electrical load connected to a source voltage line comprising the steps of:
    furnishing driving means coupling said electrical load to a common voltage line, said driving means having an input line thereto;
    providing operating current, by means of a current source, to said input line of said driving means when a not shorted condition of said electrical load to said source voltage line is detected at said input line; and
    withholding operating current to said input line of said driving means, by means of an SCR for disabling said current source, when a shorted condition of said electrical load to said source voltage line is detected at said input line.

4. An alternator including a short detection circuit for operatively controlling current in a field coil thereof connected to a battery voltage line comprising:
    means for driving said field coil having first, second and third terminals thereof, said first terminal being connected to said field coil and said second terminal being connected to a ground voltage line; and
    means for detecting a short circuit current in said field coil connected to said third terminal of said driving means, said means for detecting comprising a current source for providing an operating current to said driving means and an SCR for disabling said current source in response to a shorted condition of said field coil, said detecting means selectively withholding and providing said operating current to said driving means when a shorted and not shorted condition of said field coil to said battery voltage line is respectively detected at said third terminal of said driving means.

5. The alternator of claim 4 wherein said detecting means comprises a reset input for unlatching said SCR.

* * * * *